(12) United States Patent
Camarota

(10) Patent No.: US 6,292,388 B1
(45) Date of Patent: Sep. 18, 2001

(54) EFFICIENT AND ROBUST RANDOM ACCESS MEMORY CELL SUITABLE FOR PROGRAMMABLE LOGIC CONFIGURATION CONTROL

(75) Inventor: Rafael C. Camarota, Sunnyvale, CA (US)

(73) Assignee: Adaptive Silicon, Inc., Los Gatos, CA (US)

( * ) Notice: Subject to any disclaimer, the term of this patent is extended or adjusted under 35 U.S.C. 154(b) by 60 days.

(21) Appl. No.: 09/606,791

(22) Filed: Jun. 28, 2000

(51) Int. Cl.$^7$ .................................................. G11C 11/00
(52) U.S. Cl. .............................................. 365/156; 365/154
(58) Field of Search ..................................... 365/156, 154

(56) References Cited

U.S. PATENT DOCUMENTS 5,831,896 * 11/1998 Lattimore et al. .................... 365/154

* cited by examiner

*Primary Examiner*—David Nelms
*Assistant Examiner*—M. Tran
(74) *Attorney, Agent, or Firm*—Donald R. Boys; Central Coast Patent Agency, Inc.

(57) ABSTRACT

A memory system with an operating voltage of Vcc has a memory cell with first and second inverters connected input to output to make a latch defining a Q node and a QB node, and powered by a single voltage controlled Vmm line. There is a passgate transistor connected source to drain from a BIT line to the first inverter, the passgate having a strength low enough that, with Vmm substantially equal to Vcc and the gate of the passgate energized at Vcc by a WORD signal, no signal on the BIT line can flip the latch. Circuitry is provided for reducing the voltage of Vmm during a write cycle, so a signal on the BIT line may flip the latch. In preferred embodiments the memory system is applied to Programmable Logic Arrays.

11 Claims, 5 Drawing Sheets

Write "1"

Write "0"

Read "1"

Read "0"

EFFICIENT AND ROBUST RANDOM ACCESS MEMORY CELL SUITABLE FOR PROGRAMMABLE LOGIC CONFIGURATION CONTROL

FIELD OF THE INVENTION

The present invention is in the field of integrated circuits (ICs) and pertains in particular to a new memory cell suitable for use in programmable logic devices for configuration control.

BACKGROUND OF THE INVENTION

Arrangements of transistors in ICs to act as storage locations for binary bits (memory cells) are very well known in the art, and several different arrangements are used for different purposes. It is well known, as well, that memory cells have been integrated in many different ways in many kinds of IC devices. One such device is known as a programmable logic array (PLA), wherein memory cells are used to store bit strings that configure the PLA, that is, that program the PLA to one of the many purposes to which it may be applied. By storing different words in different patterns of memory cells in a PLA, the PLA can be configured to operate in a variety of different ways. Many reference books are available with information on both memory cells and PLAs.

In a PLA the characteristics of the memory cells are quite important. For example, the characteristics of the memory cell structure influence the power requirement and time for power up. Further, in operation of a PLA the state of the memory cells is frequently read for a variety of reasons. The characteristics of the cell structure determine the stability of cells during read operations. If a cell is relatively unstable, it may be flipped to the alternate state during a read operation.

In addition to the above, it is often desirable to alter the pattern of memory words stored in the memory cells in the PLA, to change the configuration of the PLA. In this process it is also desirable to reset the memory structure, that is, to drive all memory cells to a "1" condition, or all to a "0" condition, and then to write new data to the cells. The energy required to flip a single cell is vastly multiplied at reset because there are a very large number of memory cells in a state-of-the-art PLA. Flipping all cells results in a large current requirement. Without special design considerations in the memory system, current designs have a requirement that relatively small groups of cells may be written simultaneously.

What is clearly needed is a new and robust memory cell design that is stable for read operations, and at the same time requires a relatively low energy to flip the cell during a write operation. Just such a cell structure and operation is described in enabling detail below.

SUMMARY OF THE INVENTION

In a preferred embodiment of the present invention a memory system with an operating voltage of Vcc is provided, comprising a memory cell having first and second inverters connected input to output to make a latch defining a Q node and a QB node, and powered by a single voltage controlled Vmm line; a passgate transistor connected source to drain from a BIT line to the first inverter output, the passgate having a strength low enough that, with Vmm substantially equal to Vcc and the gate of the passgate energized at Vcc by a WORD signal, no signal on the BIT line can flip the latch; and circuitry for reducing the voltage of Vmm during a write cycle, so a signal on the BIT line may flip the latch through the passgate. In some embodiments the Vmm node is driven by the output of a NAND gate whose inputs are a WRITE signal and the WORD signal. Also in some embodiments the WORD signal is driven by the output of a NOR gate whose inputs are Address signals.

In some preferred embodiments of the invention there are multiple memory cells defining bits for a binary word, each of the cells structured as the cell of claim 1, and the WORD line is connected to the gate of a passgate transistor for each of the multiple cells, and the cells also share a common Vmm line powering the cell inverters. There may further be multiple binary words which share common bit lines.

In another aspect of the invention a Programmable Logic Array (PLA) is provided, comprising a memory system with an operating voltage of Vcc, the memory system further comprising a memory cell having first and second inverters connected input to output to make a latch defining a Q node and a QB node, and powered by a single voltage controlled Vmm line; a passgate transistor connected source to drain from a BIT line to the first inverter output, the passgate having a strength low enough that, with Vmm substantially equal to Vcc and the gate of the passgate energized at Vcc by a WORD signal, no signal on the BIT line can flip the latch; and circuitry for reducing the voltage of Vmm. The voltage on Vmm is reduced to a value substantially below Vcc during a write cycle to enable a signal on the BIT line to flip the latch through the passgate.

In some embodiments of the PLA the Vmm node is driven by the output of a NAND gate whose inputs are a WRITE signal and the WORD signal, and the WORD signal is driven by the output of a NOR gate whose inputs are Address signals.

In some embodiments the PLA may comprise multiple memory cells defining bits for a binary word, each of the cells structured as the cell of claim 1, and the WORD line is connected to the gate of a passgate transistor for each of the multiple cells for a single word, which also share a common Vmm line powering the inverters. There may in addition be multiple binary words which share common bit lines.

In another aspect of the invention a method for reducing the energy required to write to a memory cell with nodes energized by a power line Vmm is provided, comprising the steps of (a) connecting Vmm to the nodes of the memory cell through circuitry enabled to lower the voltage on Vmm while a Write signal is asserted; and (b) energizing a passgate to one of the nodes of the cell for a period of time common to the period of time that voltage is lowered on Vmm.

In embodiments of the invention taught in enabling detail below, for the first time a memory cell is provided that is more stable to accidental changing of state than is the case with conventional memory cells, and that also minimizes the energy required to write to the cells, so, in many applications, many more bits may be written or reset at the same time than has been possible with devices of the prior art.

BRIEF DESCRIPTION OF THE DRAWING FIGURES

DESCRIPTION OF THE PREFERRED EMBODIMENTS

Figure 1:
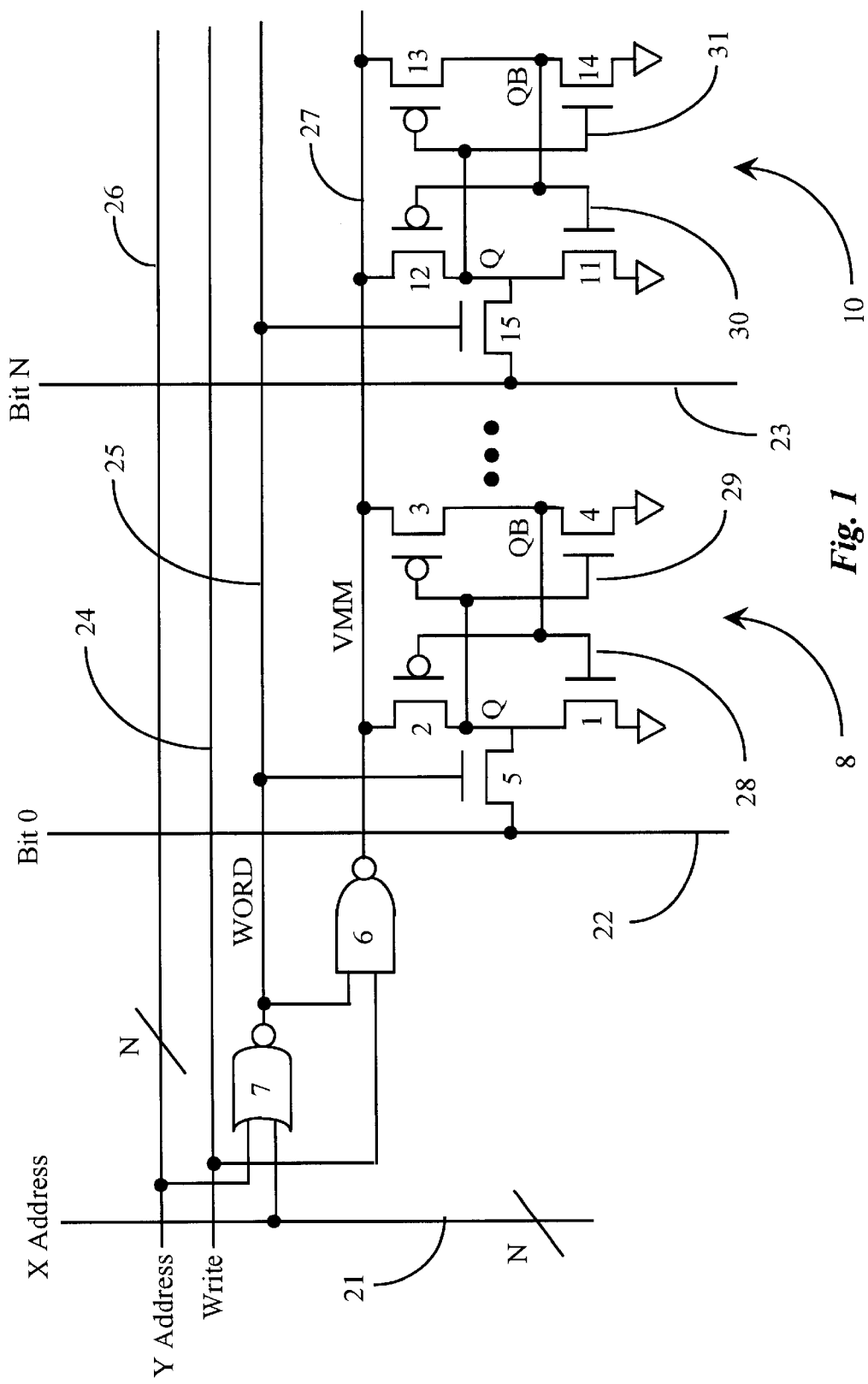
FIG. 1 is a schematic representation of two memory cells and connections to other structures in a PLA according to an embodiment of the present invention.

FIG. 1 is a schematic diagram showing two memory cells 8 and 10 according to a preferred embodiment of the present invention, together with connections, interconnections, and peripheral structure. Each cell stores one bit, and two bit lines are shown, one labeled Bit 0, and the other Bit N. This labeling is because the two cells shown are meant to represent an arbitrary number of such cells, creating matrices capable of storing a plurality of bit strings (binary words) as is common in most memory devices.

Each memory cell has 4 transistors arranged to make up a latch, and a fifth transistor acting as a passgate. In cell 8 the four transistors are transistors 1, 2, 3 and 4; in cell 10 they are 11, 12, 13 and 14. Referring now only to cell 8, transistors 1 and 2, in which transistor 1 is a NMOS device and transistor 2 is a PMOS device, define a first inverter, and transistors 3 (PMOS) and 4 (NMOS) define a second inverter. The inverters are hooked up input to output to make a latch. The latch input to output nodes are designated as Q and QB respectively, and the interconnecting lines themselves are labeled 29 and 28 respectively. In cell 10 there is analogous structure, as shown.

The inverter PMOS device sources (2 and 3 in cell 8, 12 and 13 in cell 10) are not connected to supply voltage Vcc (not shown) at all times, as is typical of conventional memory cells, but by a special source Vmm, which is output of a NAND gate 6. Vmm is used in the writing process. The bulk or N-Well taps of the inverter PMOS devices go to the system Vcc node and not to Vmm.

The fifth transistor of each cell is a passgate for that cell (element 5 for cell 8, and element 15 for cell 10). Each passgate is connected between the Q node of the associated cell and a common BIT node. The BIT nodes are labeled 22 and 23 respectively for cells 8 and 10. The gates of passgate devices 5 and 15 are connected to a common WORD line, also labeled as line 27. The memory in the instant example is organized into words of N bits. The number of bits in a word is not germane to the operation of the system or to the invention.

In preferred embodiments of the present invention WORD node 25 is output of a NOR gate 7, whose inputs are X address and Y address.

In a preferred embodiment, enabled for PLAs, there are 32 bits to a word, requiring therefore 32 memory cells like the two shown in FIG. 1 for each word. The 32 memory cells in the same word share the same WORD and Vmm signals, labeled 25 and 27 respectively. There are 32 BIT signals (BIT 0 to BIT 31) that are common for the respective bits of each word in the memory system, and these 32 bit signals are represented by BIT 0 and BIT N.

The sizing of the latch inverters and the Q to BIT passgate is based on two constraints. The passgate is sized such that when Vmm and WORD are at a voltage substantially equal to Vcc, any voltage on the BIT node will not flip the value in the memory cell latch. This is true for both stable states of the latch, Q at Vcc or Q at GND. This provides stability against accidental flipping of the gates during read operations.

Secondly, during a read the Q and QB node voltages are altered from their normal Vcc or GND levels, but not enough to flip the cell or to cause incorrect operation of the programmable logic, which the memory cell might control. If these two constraints are met, then the cell cannot be written through the Q to BIT passgate when Vmm is at Vcc. To write to the cell the Vmm node voltage must be reduced to make the inverter latch weaker so that the BIT to Q passgate can flip the state of the latch.

Reducing the Vmm voltage, which is accomplished by the novel arrangement of gates 6 and 7 and their input and output interconnections, has two functions. Firstly, this allows the intentionally weak passgate to flip the latch. Secondly, this substantially reduces the transient current needed to flip a cell. For example, when the Vmm is at a voltage below the threshold of the NMOS and PMOS devices making up the latch the cell flips very easily. A flipped cell will power up as Vmm is raised to normal Vcc since the high node Q or QB will follow to Vcc as the Vmm signal rises to Vcc.

In typical memory applications only one word is written at a time because of the substantial energy requirements to write to the conventional cell structures. The transient current is thus limited, because only a limited number of cells (the number of cells in a word) are flipped at any one time, and only one cell per BIT line is flipped at any point in time. Memory arrays used as configuration control for programmable logic, however, have a need to be globally reset during a power-up cycle, and there is a need to reset relatively large blocks of the configuration control memory as part of a dynamic reconfiguration strategy.

In a conventional memory cell too many cells written on one BIT line would overwhelm the strength of a BIT line driver. Further, too many cells flipping at the same time will require more current then the Vcc and GND nodes could supply, either because of IR drop, current density, or overall chip ICC limits. Keeping in mind that a programmable logic device might need to have more then 100,000 memory latches reset at the same time. Even at a few uA for each latch, hundreds if not thousands of milliamps might be required during reset.

FIGS. 2a through 2d are timing diagrams of write and read operations for the system of FIG. 1 according to a preferred embodiment of the present invention.

Figure 2A:
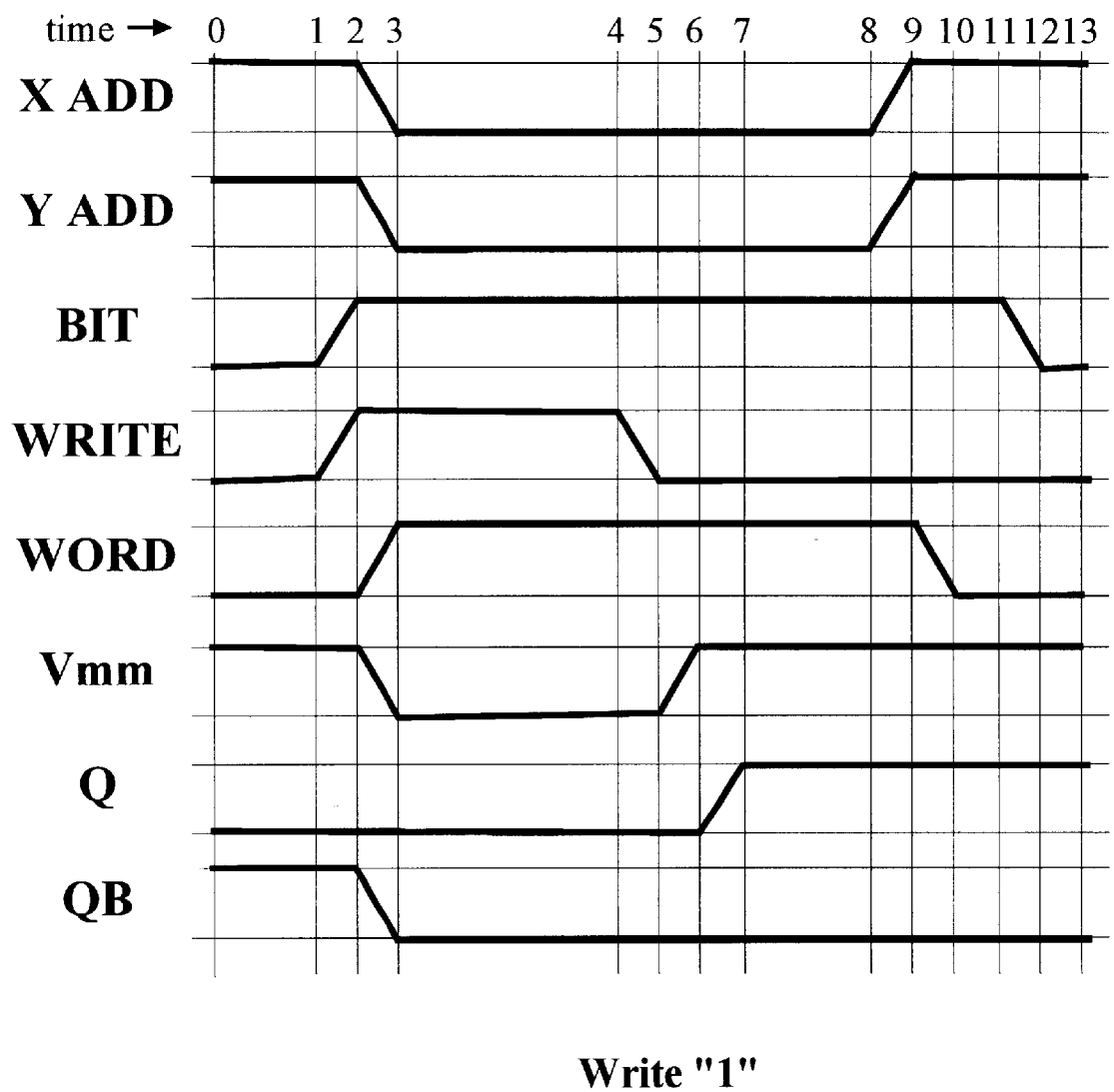
FIG. 2a is a timing diagram for a Write "1" operation in an embodiment of the present invention.

Referring first to FIG. 2a, which shows the signal timing for a write of "1" to a cell of FIG. 1:

(a) at time 1 both the BIT and the Write signals are asserted. Referring to FIG. 1, and considering just cell 8, BIT 0 asserts Vcc at the input of passgate 5, and the WRITE signal is an input to NAND gate 6. Because of the fact that WORD has not been asserted, the output of 6 (Vmm) is essentially Vcc, and Vcc on the BIT line cannot flip the latch.

(b) at time 2 both X and Y address signals are asserted (active low), and, as both are inputs to NOR gate 7, WORD becomes, as a result, active high at time 3.

(c) As WORD is an input to NAND gate 6, and the other input to NAND gate 6, WRITE, went high at time 2, Vmm, the output of NAND gate 6, goes low at time 3.

(d) because Vmm is below the threshold of the NMOS and the PMOS devices making up the latch, QB goes low at time 3, and now the input on the BIT line can flip the latch.

(e) at time 4 the Write signal is asserted low, so Vmm goes to Vcc by time 6. Because Vmm goes to Vcc, Q goes to Vcc, and the write is accomplished. Now, because, again, of the intentionally weak passgate, any change in the signal on the BIT line cannot flip the latch.

In this novel approach the Write is accomplished essentially by making the proper signals, then lowering the voltage on Vmm to allow the latch to flip.

Figure 2B:
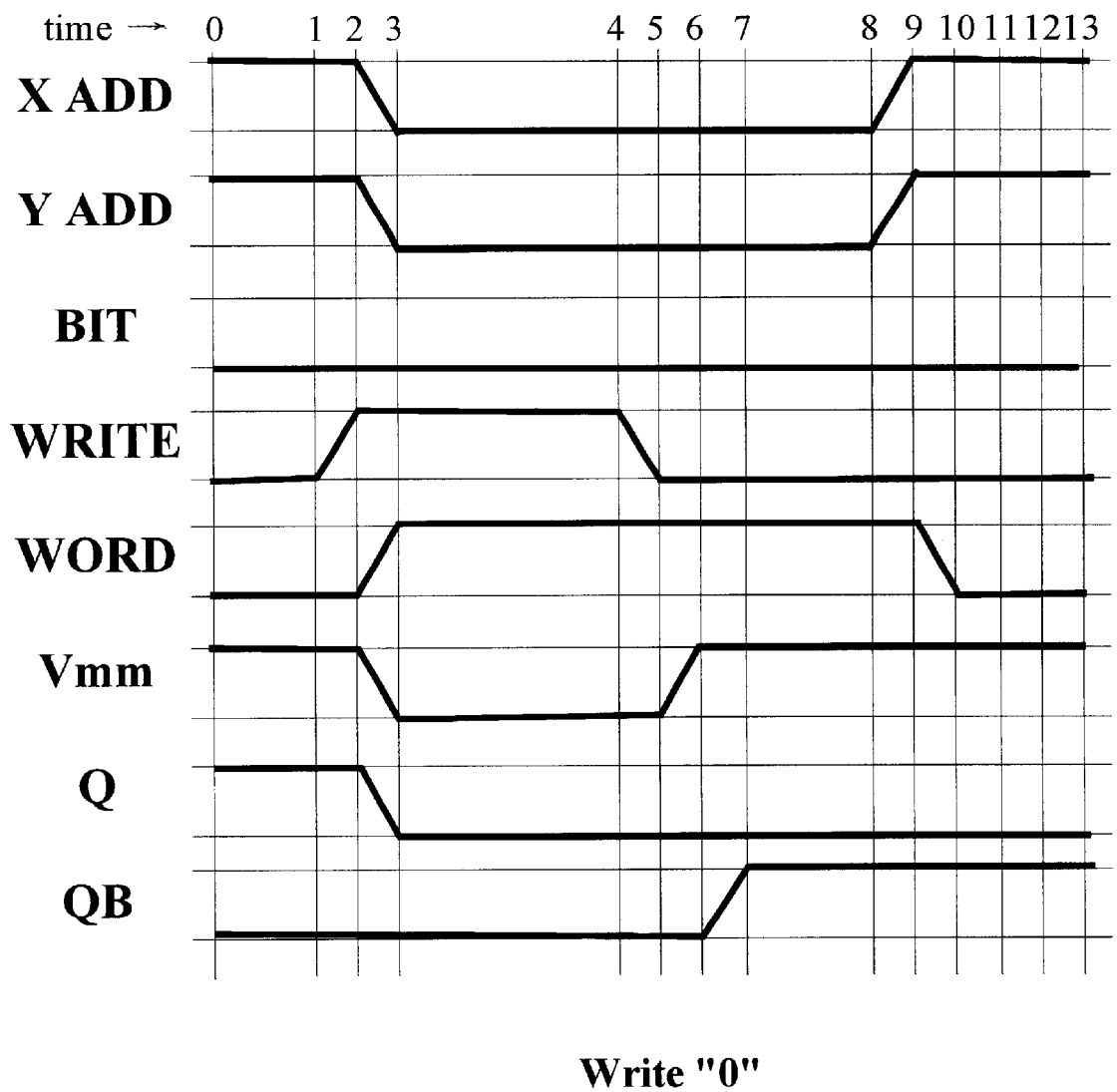
FIG. 2b is timing diagram for a Write "0" operation in an embodiment of the present invention.

Referring now to FIG. 2b, which shows the signal timing for a write of "0" to a cell of FIG. 1:

(a) All signals asserted save the BIT signal are asserted at the same times and in the same way as for the "1" write described just above. In this case the BIT signal stays low.

(b) While Vmm is at Vcc with an intentionally weak passgate, no signal on BIT can flip the latch. When Vmm falls beginning at time 2, as in the write "1" case, the Q value goes to 0.

(c) when the write signal ends beginning at time 4, Vmm starts up, and then QB charges up to Vcc.

(d) Now, since Vmm is charged up to Vcc again, no change on BIT will flip the latch.

Figure 2C:
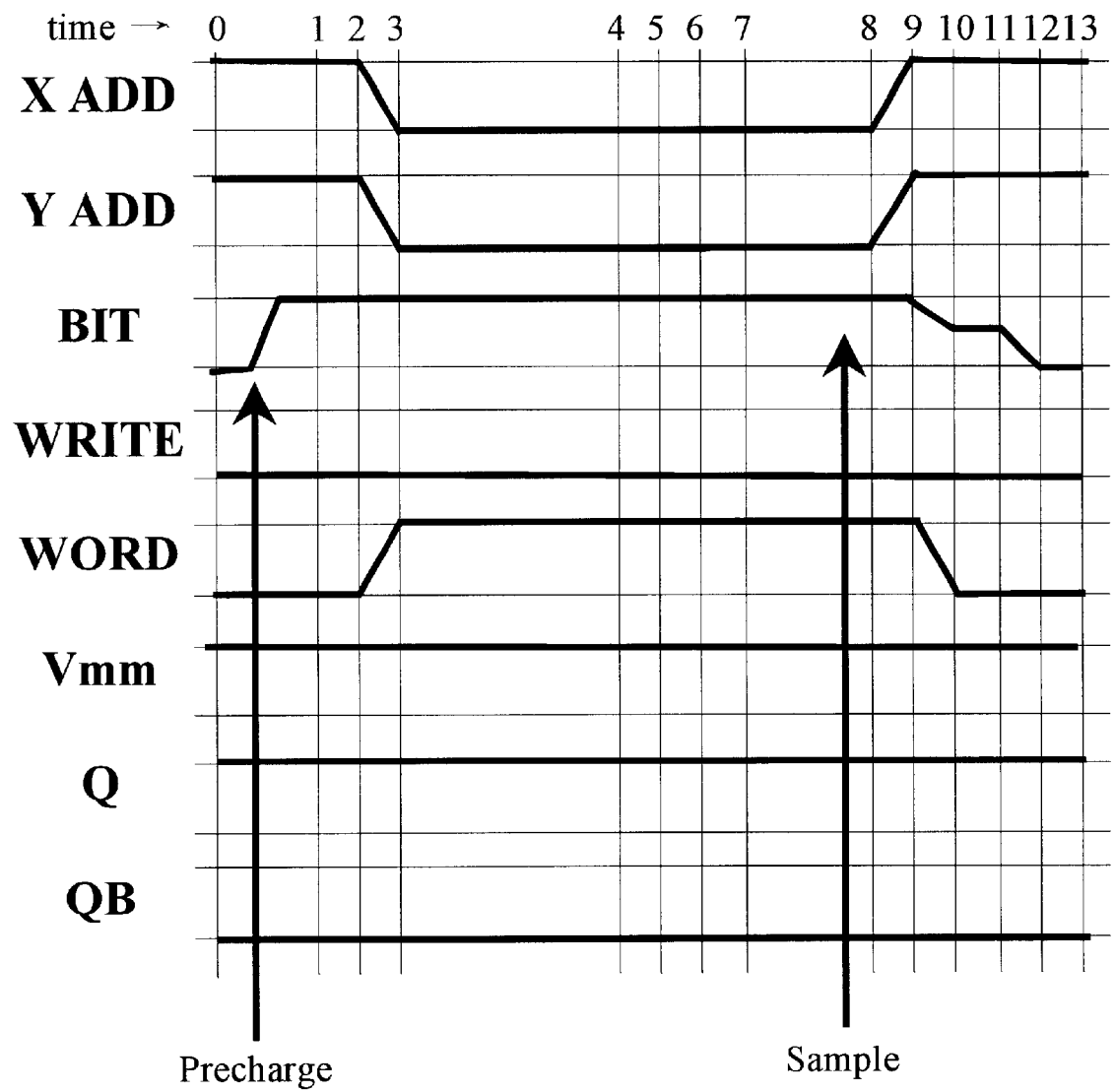
FIG. 2c is a timing diagram for a Read "1" operation in an embodiment of the present invention.

Referring now to FIG. 2c, which illustrates a read "1":

(a) Bit is asserted prior to time 2, as shown, to precharge the bit line.

(b) X address and Y address are asserted at the same times and in the same way as before.

(c) WRITE is never asserted, so Vmm stays high (Vcc).

(d) when WORD is asserted, by virtue of the Address signals, the intentionally weak passgate allows Q (high) to reinforce the precharge "1" on BIT.

(e) sample is taken in this case at just before time 8, and before WORD goes low by virtue of X and Y address signals being driven high at time 9, which causes WORD to go low, turning off passgate 5. With the passgate turned off after time 9 the voltage on BIT begins to decay (not further reinforced by Q).

Figure 2D:
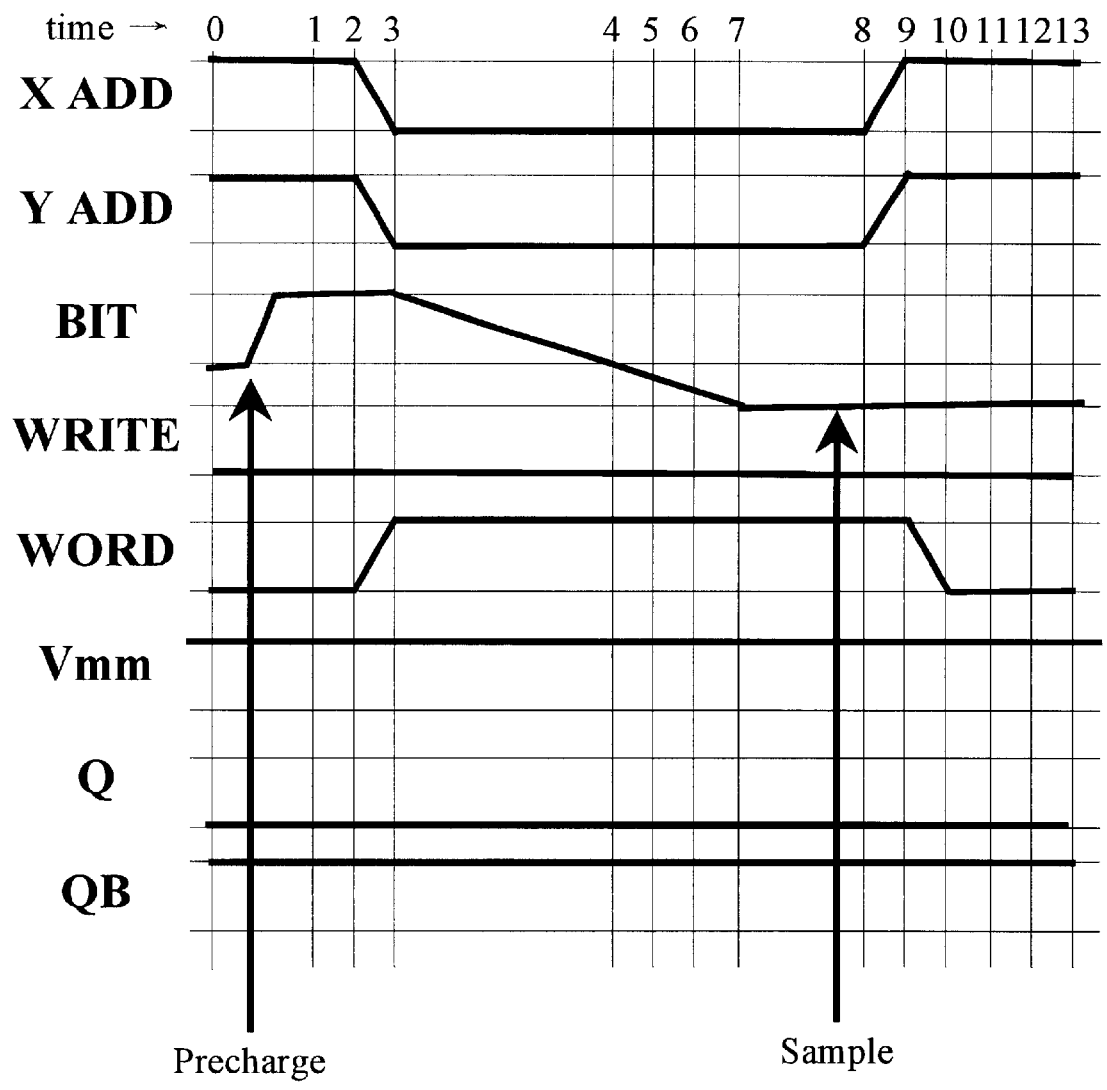
FIG. 2d is a timing diagram for a Write "0" operation in an embodiment of the present invention.

Referring finally to FIG. 2d, which shows the case for reading a 0:

(a) Bit is precharged prior to time 2 as for read "1" described above.

(b) X address and Y address are asserted as before.

(c) When WORD goes high at time 3, as a result of inputs X and Y address to NOR gate 7, intentionally weak passgate 5 is turned on.

(d) because the passgate is weak, the "1" on BIT cannot flip the latch. Therefore the BIT signal begins to fall.

(e) At time 7 BIT is at 0, and is again sampled before time 8, as shown, reading a "0".

With the Vmm in the embodiment of the invention described above with reference to FIG. 1 at a depressed level the DC crossover current during reset can be reduced to nanoamps (nA). In one embodiment the DC crossover current limit is managed to be <10nA per bit, worst case, during a reset. There is also a transient current caused by the transition of the Vmm node from Low to High, but this is proportional to the capacitance of the Vmm node, and by the rise time of the Vmm node.

To reset a single word, writing all zeros, the BIT is at 0 volts, the appropriate X and Y address are at 0 volts making the WORD line Vcc. Then the WRITE signal is pulsed momentarily to Vcc. This in turn pulses Vmm low, allowing the intentionally weak pass gate to flip the latch as the Vmm is rising back to Vcc. The organization of the X and Y Address is such that if multiple X's and Y's were enabled simultaneously then multiple words could be reset at the same time at a very low power level.

The memory cell is initialized to zero at power up by applying WRITE and all Address lines when Power On Reset (POR) is present (POR not shown in the diagrams). The BIT lines are all zero at this time as well. When the WRITE is removed first after POR is removed, followed some short time, say 10–20 ns, by the address lines. In preferred embodiments the address signals are removed in phases separated by a few ns to reduce transient power required to switch all the WORD line capacitance.

In a further aspect of the present invention, memory cells according to preferred embodiments taught herein have much higher tolerance to process variations than do structures known in the current art. In embodiments of the present invention, since the strength of the passgate is not crucial to writing efficiency, the passgate strength can be made weaker due to eased writing requirements, providing additional margin during read. This wide operating range is useful in allowing additional process variation than has before been possible, and allows for rapid process migration.

It will be apparent to the skilled artisan that there are many alterations that may be made in the embodiments of the invention described herein without departing from the spirit and scope of the invention. For example, it is central to the invention that a memory cell have a relatively weak passgate, so the latch will be very stable, such that capacitance (for example) on a bit line cannot cause a latch to flip unintentionally. To achieve this condition without further innovation it would be difficult to write to a cell, and a lot of energy would be required. The further innovation in the present case is to add logic circuitry that alters the power side of the cells, to which the PMOS transistors are connected, so the voltage at that point, which is typically the full operating voltage of the circuitry (Vcc), is driven to a low value, making the cell easy to write with a minimum of energy.

The logic circuitry shown (see FIG. 1) accomplishes the above function. It is, however, just one of a number of circuits by which the function may be accomplished. There are similarly other variations within the spirit and scope of the invention, for example the circuitry involving gates 6 and 7 may be implemented in a number of different ways. Accordingly the invention should be accorded the breadth of the claims that follow.

What is claimed is:

1. A memory system with an operating voltage of Vcc comprising:

a memory cell having first and second inverters connected input to output to make a latch defining a Q node and a QB node, and powered by a single voltage-controlled Vmm line;

a passgate transistor connected source to drain from a BIT line to the first inverter output, the passgate having a strength low enough that, with Vmm substantially equal to Vcc and the gate of the passgate energized at Vcc by a WORD signal, no signal on the BIT line can flip the latch; and circuitry for reducing the voltage of Vmm during a write cycle, so a signal on the BIT line may flip the latch through the passgate.

2. The memory system of claim 1 wherein the Vmm node is driven by the output of a NAND gate whose inputs are a WRITE signal and the WORD signal.

3. The memory system of claim 2 wherein the WORD signal is driven by the output of a NOR gate whose inputs are Address signals.

4. The memory system of claim 1 comprising multiple memory cells defining bits for a binary word, each of the cells structured as the cell of claim 1, and wherein the WORD line is connected to the gate of a passgate transistor for each of the multiple cells, and wherein the cells also share a common Vmm line powering the cell inverters.

5. The memory system of claim 4 further comprising multiple binary words which share common bit lines.

6. A Programmable Logic Array (PLA), comprising:
  a memory system with an operating voltage of Vcc, the memory system comprising:
    a memory cell having first and second inverters connected input to output to make a latch defining a Q node and a QB node, and powered by a single voltage-controlled Vmm line;
    a passgate transistor connected source to drain from a BIT line to the first inverter output, the passgate having a strength low enough that, with Vmm substantially equal to Vcc and the gate of the passgate energized at Vcc by a WORD signal, no signal on the BIT line can flip the latch; and
    circuitry for reducing the voltage of Vmm;
  wherein the voltage on Vmm is reduced to a value substantially below Vcc during a write cycle to enable a signal on the BIT line to flip the latch through the passgate.

7. The PLA of claim 6 wherein the Vmm node is driven by the output of a NAND gate whose inputs are a WRITE signal and the WORD signal.

8. The PLA of claim 7 wherein the WORD signal is driven by the output of a NOR gate whose inputs are Address signals.

9. The PLA of claim 6 comprising multiple memory cells defining bits for a binary word, each of the cells structured as the cell of claim 1, and wherein the WORD line is connected to the gate of a passgate transistor for each of the multiple cells for a single word, which also share a common Vmm line powering the inverters.

10. The PLA of claim 9 further comprising multiple binary words which share common bit lines.

11. A method for reducing the energy required to write to a memory cell with nodes energized by a power line Vmm, comprising the steps of:
  (a) connecting Vmm to the nodes of the memory cell through circuitry enabled to lower the voltage on Vmm while a WRITE signal is asserted; and
  (b) energizing a passgate to one of the nodes of the cell for a period of time common to the period of time that voltage is lowered on Vmm.

* * * * *